United States Patent
Schoenmakers et al.

(10) Patent No.: US 10,593,068 B2
(45) Date of Patent: Mar. 17, 2020

(54) TOMOGRAPHIC IMAGING METHOD

(71) Applicant: FEI Company, Hillsboro, OR (US)

(72) Inventors: Remco Schoenmakers, Best (NL); Pavel Potoček, Eindhoven (NL)

(73) Assignee: FEI Company, Hillsboro, OR (US)

( * ) Notice: Subject to any disclaimer, the term of this patent is extended or adjusted under 35 U.S.C. 154(b) by 0 days.

(21) Appl. No.: 15/688,768

(22) Filed: Aug. 28, 2017

(65) Prior Publication Data

US 2018/0082444 A1    Mar. 22, 2018

(30) Foreign Application Priority Data

Sep. 19, 2016 (EP) .................................. 16189519

(51) Int. Cl.
*G06K 9/00* (2006.01)
*G06T 11/00* (2006.01)
(Continued)

(52) U.S. Cl.
CPC .......... *G06T 11/003* (2013.01); *G06T 11/006* (2013.01); *H01J 37/222* (2013.01);
(Continued)

(58) Field of Classification Search
CPC . G03F 9/7092; G03F 1/78; G03F 1/84; G06T 11/003; G06T 2211/424; G06T 11/005; G06T 2207/10081; G06T 2207/10116; G06T 2207/10056; G06T 2207/10072; G06T 7/0004

See application file for complete search history.

(56) References Cited

U.S. PATENT DOCUMENTS

2003/0108155 A1* 6/2003 Wilkins ................. H01J 35/08
378/119
2005/0123097 A1* 6/2005 Wang ..................... H01J 35/08
378/143
(Continued)

FOREIGN PATENT DOCUMENTS

WO    WO 2016/023751    2/2016

OTHER PUBLICATIONS

Boughorbel et al., "SEM 3D Reconstruction of Stained Bulk Samples using Landing Energy Variation and Deconvolution," *Microsc. Microanal.*, 18:560-561 (2012).
(Continued)

*Primary Examiner* — Vu Le
*Assistant Examiner* — Guillermo M Rivera-Martinez
(74) *Attorney, Agent, or Firm* — Klarquist Sparkman, LLP

(57) ABSTRACT

Methods of investigating a specimen using tomographic imaging include directing a beam of radiation through a specimen and onto a detector, thereby generating an image of the specimen. The directing is repeated for different specimen orientations relative to the beam, thereby generating a corresponding set of images. An iterative mathematical reconstruction technique is used to convert the images into a tomogram. The reconstruction is mathematically constrained to curtail a solution space using three-dimensional SEM imagery of at least a part of the specimen that overlaps the tomogram by requiring iterative results of the reconstruction to be consistent with pixel values derived from the SEM imagery.

19 Claims, 2 Drawing Sheets

(51) Int. Cl.
*H01J 37/22* (2006.01)
*H01J 37/28* (2006.01)

(52) U.S. Cl.
CPC ......... *H01J 37/28* (2013.01); *G06T 2211/424* (2013.01); *G06T 2211/436* (2013.01); *H01J 2237/226* (2013.01); *H01J 2237/2611* (2013.01)

(56) References Cited

U.S. PATENT DOCUMENTS

| | | | |
|---|---|---|---|
| 2009/0161932 A1 | 6/2009 | Chen | |
| 2009/0220130 A1* | 9/2009 | Slingerland | G01N 21/6428 382/128 |
| 2012/0075601 A1* | 3/2012 | Den Boef | G01N 21/47 355/67 |
| 2014/0064445 A1* | 3/2014 | Adler | G21K 7/00 378/43 |
| 2014/0070099 A1* | 3/2014 | Aliman | H01J 37/26 250/307 |
| 2017/0146787 A1* | 5/2017 | Reed | G02B 21/365 |
| 2017/0191945 A1* | 7/2017 | Zhang | G01N 21/8851 |
| 2017/0221194 A1* | 8/2017 | Ebstein | G06T 7/0004 |
| 2018/0046885 A1* | 2/2018 | Barker | G06T 7/75 |

OTHER PUBLICATIONS

Brownlow et al., "Towards 50-Nanometre Resolution with an SEM-Hosted X-Ray Microscope," *Microscopy and Analysis*, pp. 13-15 (Mar. 2006).

Extended European Search Report from European Patent Application No. 16189519.8, dated Mar. 21, 2017, 13 pages.

Gondrom et al., "Digital computed laminography and tomosynthesis—functional principles and industrial applications," NDT.net, 4, 5 pages (Jul. 1999).

Gondrom et al., "X-ray computed laminography: an approach of computed tomography for applications with limited access," *Nuclear Engineering and Design* 190:141-147 (1999).

Kawase et al., "Transmission electron microtomography without the "missing wedge" for quantitative structural analysis," *Ultramicroscopy*, 107:8-15 (2007).

Lich et al., "Towards tracing small neurites in three dimensional electron microscopy data: How "confocal Scanning Electron Microscopy," helps to achieve high resolution isotropic data," Abstracts of the Annual Meeting of the Society for Neuroscience, 42, 2 pages (Jan. 2012).

Rezvani, Nargol, "Reconstruction Algorithms in Computerized Tomography," Cairns 2009, 39 pages (2009).

Varentsov et al., "First biological images with high-energy proton microscopy," Phys. Med., 29:208-213 (Mar. 2013).

* cited by examiner

TOMOGRAPHIC IMAGING METHOD

CROSS REFERENCE TO RELATED APPLICATION

This application claims priority to European Patent Application No. 16189519.8, filed Sep. 19, 2016, which is incorporated herein by reference.

BACKGROUND

Because a tomographic reconstruction is generally an under-determined problem, it produces a solution space (extended set of potential solutions) rather than a unique solution. Such a solution space will typically include (significant numbers of) "dud" solutions that are, for example, physically impossible and/or an inaccurate representation of the specimen under investigation. In order to "weed-out" such dud solutions from the solution space, the reconstruction procedure is generally subjected to one or more constraints, e.g. by discarding negative results and/or results that contain (certain types of) discontinuities, for instance.

A fundamental problem with tomographic imaging is the finite/bounded nature of the input set of images on which reconstruction is performed. More particularly, if said input set comprises large "voids" (e.g. collections of lines of sight for which there are no input images available, or only a sparse collection of input images), then this can lead to significant inaccuracies/limitations in the associated tomogram. Typically, of the theoretically possible $4\pi$ steradian ($2\pi$ degree) angular extent of potential lines of sight relative to the specimen, one or more angular ranges are missing from the accumulated set of input images, e.g. due to a limited tilt range of the employed specimen holder, apparatus obscuration effects, etc. This is commonly referred to as the "missing wedge" problem. For lines of sight that have a relatively large elevation angle relative to the specimen, parts of the specimen image will be projected into regions that are not present in the reconstruction volume. This is commonly referred to as the "local tomography" effect. Apart from causing visible artifacts in the reconstructed tomogram, such effects also cause significant ill-posedness of the mathematical reconstruction problem, causing the resolution and fidelity of the resulting tomogram to be extremely sensitive to noise, with sub-optimal reconstructions as a result.

Although prior-art tomographic imaging techniques have produced tolerable results up to now, innovative alternatives to conventional approaches are needed and are disclosed below.

SUMMARY

The invention relates to a method of investigating a specimen using tomographic imaging, comprising the following steps:
  Providing a specimen on a specimen holder;
  Directing a beam of radiation through the specimen and onto a detector, thereby generating an image of the specimen;
  Repeating said directing step for a set of different specimen orientations relative to said beam, thereby generating a corresponding set of images;
  Using an iterative mathematical reconstruction technique to convert said set of images into a tomogram of at least a portion of the specimen;
  Mathematically constraining said reconstruction, so as to curtail a solution space resulting therefrom.

The invention also relates to a tomographic imaging apparatus that can be used in performing such a method.

The invention further relates to a charged-particle microscope in which such a tomographic imaging apparatus is comprised.

BRIEF DESCRIPTION OF THE DRAWINGS

The invention will now be elucidated in more detail on the basis of exemplary embodiments and the accompanying schematic drawings, in which.

DETAILED DESCRIPTION

Figure 1A:
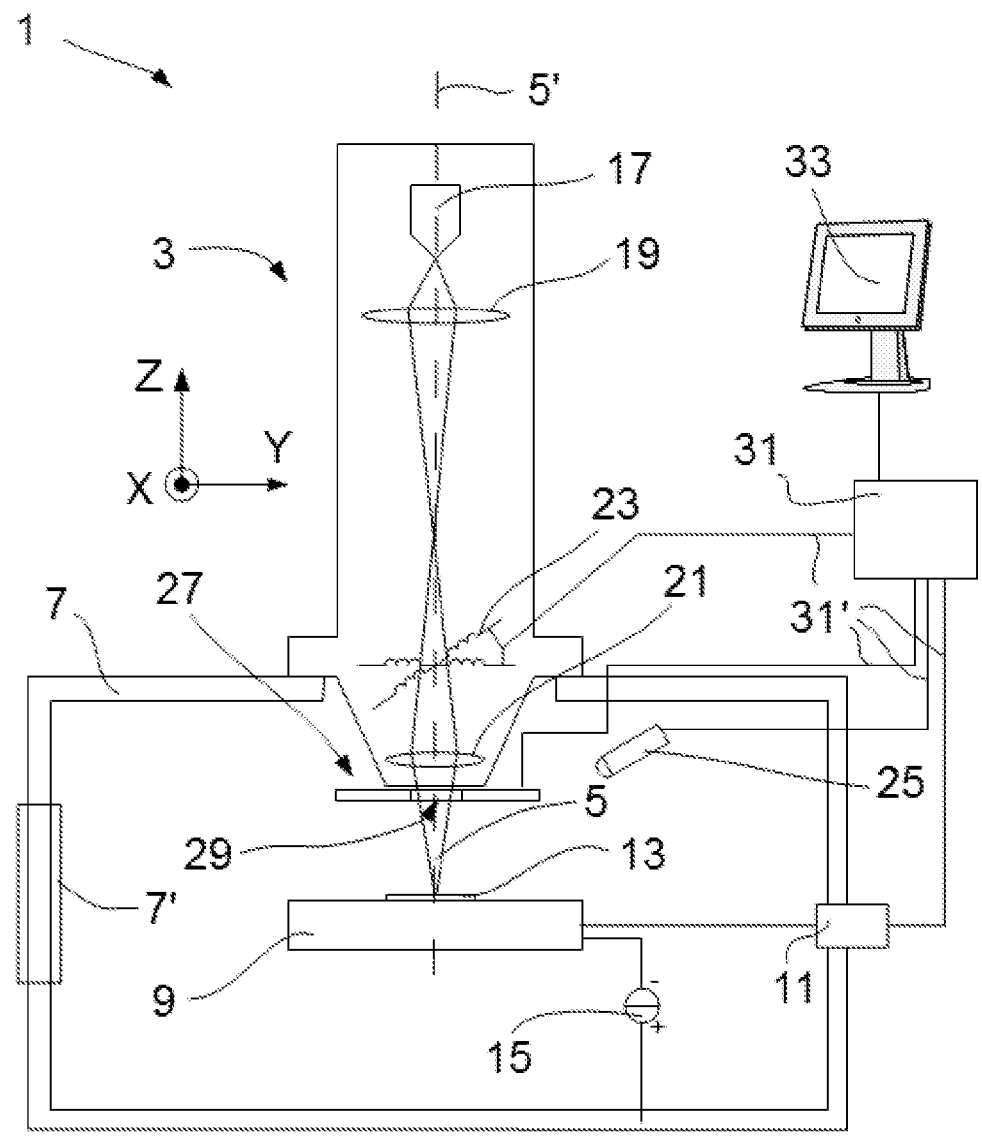
FIG. 1A renders a longitudinal cross-sectional elevation of a CPM in which an embodiment of the current invention can be carried out using a CT module.

In tomographic imaging (also referred to as Computed Tomography (CT)) as referred to above, a radiation source and (diametrically opposed) detector are used to look through a specimen along different lines of sight, so as to acquire penetrative observations of the specimen from a variety of perspectives; these are then used as input to a mathematical procedure that produces a reconstructed "volume image" (tomogram) of (part of) the (interior of the) specimen. In order to achieve a series of different lines of sight as alluded to here, one can, for example, choose to:
  (a) Keep the source and detector static and move the specimen relative to them.
  (b) Keep the specimen static and move the source relative to it. In this case, one can elect to:
    Move the detector in synchronization with the source; or
    Embody the detector as a (static) array of sub-detectors, with positions matched to correspond to the different positions to be assumed by the source.
  (c) Employ a "cloud" of sources (and associated detectors) in static arrangement around the specimen, and invoke different sources either serially or concurrently.

The beam of radiation that traverses the specimen can, for example, be regarded as being cone-like (thus yielding so-called cone beam tomography) or resembling a segment of a disc (thus yielding so-called fan beam tomography), depending on the geometry/shape that the detector "presents" to the source; a parallel/collimated beam is also possible. In order to achieve sufficient sample penetration, the employed radiation will typically comprise X-rays or accelerated charged particles.

Tomographic imaging as referred to here can be performed using a standalone apparatus, which is conventionally the case in medical imaging applications, for example, where the specimen (e.g. a human or animal) is macroscopic. Standalone CT tools are also available for performing so-called "micro CT", in which a micro-focused source is used to image microscopic specimens, e.g. in geology/petrology, biological tissue studies, etc. Continuing this drive toward ever-greater resolution, so-called "nano CT" instruments have also been developed; these may be standalone tools, but, for example, they may also be embodied as (add-on) modules for (a vacant vacuum/interface port of) a charged-particle microscope (CPM)—such as a (S)TEM or SEM—in which case the CPM's charged-particle beam is used to irradiate the specimen directly, or to irradiate a metal target so as to cause production of an imaging X-ray beam. As referred to in this document, the concept of tomography should be broadly construed as encompassing so-called laminography. More information on (some) of these topics can, for example, be gleaned from the following entries at en.wikipedia.org: Tomography, X-ray_microtomography, Nanotomography, Electron_tomography. It should be noted that, as referred to here in the context of a CPM, the phrase "charged particle" should be broadly construed as encompassing:

Electrons, as in the case of a Transmission Electron Microscope (TEM), Scanning Electron Microscope (SEM), and Scanning Transmission Electron Microscope (STEM), for instance. See, for example, the following entries at en.wikipedia.org: Electron_microscope, Scanning_electron_microscope, Transmission_electron_microscopy, and Scanning_transmission_electron_microscopy.

Ions, which may be positive (e.g. Ga or He ions) or negative. Such ion beams can be used for imaging purposes, but they are also often used for surface modification purposes, e.g. as in the case of Focused Ion Beam (FIB) milling, Ion-Beam-Induced Deposition (IBID), Ion-Beam-Induced Etching (IBIE), etc. See, for example, the following wikipedia references: Focused_ion_beam and Scanning_Helium_Ion_Microscope. See also, W. H. Escovitz, T. R. Fox and R. Levi-Setti, *Scanning Transmission Ion Microscope with a Field Ion Source*, Proc. Nat. Acad. Sci. USA 72(5), pp 1826-1828 (1975).

Other charged particles, such as protons and positrons, for instance.

It should also be noted that, in addition to imaging and/or surface modification, a charged particle beam in a CPM may also have other functionalities, such as performing spectroscopy, examining diffractograms, etc. The present invention will predominantly concern itself with tomography as applied to image microscopic specimens, including specimens that are microscopic sub-portions of larger/macroscopic objects.

As regards the mathematical reconstruction technique used to produce a tomogram from a series of input images, use can be made of algorithms such as SIRT (Simultaneous Iterative Reconstruction Technique), ART (Algebraic Reconstruction Technique), DART (Discrete ART), SART (Simultaneous ART), MGIR (Multi-Grid Iterative Reconstruction), and many others.

It is an object of the invention to provide an innovative tomographic imaging technique. More specifically, it is an object of the invention that this technique should employ a radically different mathematical constraining strategy as compared to known techniques. In particular, it is an object of the invention that this technique should offer a solution (inter alia) for the abovementioned "missing wedge" and "local tomography" problems.

These and other objects are achieved in a method as set forth in the opening paragraph above, which method is characterized by the following steps:

Obtaining three-dimensional SEM imagery of at least a part of the specimen that overlaps at least partially with said portion;

Using said SEM imagery to perform said constraining step, by requiring iterative results of said reconstruction to be consistent with pixel values derived from said SEM imagery.

Three-dimensional SEM imaging is a technique that was recently developed by the assignee of the present application. It is a reconstructive technique that can be summarized as follows:

For each of a set of sample points in a scan path, one records an output $D_n$ of a SEM detector as a function of a value $P_n$ of a selected measurement parameter P, thus compiling a measurement set $M=\{(D_n, P_n)\}$, where n is a member of an integer sequence;

Using computer processing apparatus, one automatically deconvolves the measurement set M and spatially resolves it so as to produce three-dimensional reconstructed imagery of the specimen under investigation.

This genus approach can be sub-divided into a number of different species, as set forth in the following patent documents (incorporated herein by reference):

(i) U.S. Pat. No. 8,232,523/EP 2 383 768 B1, in which P is a property of the (incoming) radiation beam—such as beam energy, beam convergence angle or beam focal depth—and spatial resolution (deconvolution) of M is performed using a statistical Blind Source Separation (BSS) algorithm.

(ii) U.S. Pat. No. 8,581,189/EP 2 557 586 B1, in which P is again a property of the (incoming) radiation beam—such as beam energy, beam convergence angle or beam focal depth—and deconvolution of M is performed using a generalized three-dimensional reconstruction technique, e.g. on the basis of a Bayesian statistical approach.

(iii) U.S. Pat. No. 8,586,921/EP 2 557 587 B1, in which P is a property of the (outgoing) radiation flux (emanating from the specimen in response to irradiation thereof)—specifically emission angle (e.g. of emitted secondary electrons)—and deconvolution of M is again conducted using a general volumetric reconstruction algorithm.

(iv) U.S. Pat. No. 8,704,176/EP 2 648 208 A2, in which P is again a property of the (outgoing) radiation flux—specifically energy of emitted electrons—and deconvolution of M is once more achieved using three-dimensional reconstructive mathematics.

Reference to three-dimensional SEM imagery in this document should be construed as referring to these (and other) techniques that allow a 3D image to be assembled in a SEM or other non-transmission charged-particle microscope.

The basic idea behind the invention is to use details from 3D SEM imagery of (a relevant part of) the specimen to test whether given (intermediate) solutions in the possible solution space of a tomographic reconstruction are producing results that are realistic (i.e. consistent with the 3D SEM data—in which case the solutions in question can be kept) or unrealistic (i.e. at variance with the 3D SEM data—in which case the solutions in question can be discarded). The 3D SEM data can be rendered usable as a reference/constraint for (autonomous use in/by) the tomographic reconstruction using a variety of methods, as long as the data of one imagery type (e.g. 3D SEM) is cast to a descriptor that is similar for the other imagery type (e.g. tomography). As examples, one can, for instance, consider the following approaches:

Identifying/labeling features in the 3DSEM data (and assigning coordinate positions thereto) on the basis of pixel values. For example, greyscale values associated with pixels can be used by (commercially available) machine vision/image recognition software to automatically detect feature boundaries (and, thus, locations, shapes and sizes of features). This can be referred to as a pixel segmentation approach.

Calculated greyscale gradients are independent of contrast/brightness differences in in imagery, and can be used to directly compare 3DSEM with tomography. This can be referred to as a pixel gradient approach.

One could transform both dataset greyscales to atomic scattering coefficients, for example, and use those to perform a comparison. Such a technique is based on physics rather than pure mathematics, and can be referred to as a physical attributes approach.

One could ask why, if one already has 3D SEM data for a given specimen, there is a need/desire to perform tomographic imaging on that specimen at all. However, the skilled artisan will realize that, for example, the tomographic imaging may use a different type of probing radiation (e.g. X-rays, or higher-energy electrons, or other charged particles) to the 3D SEM imagery, which may be more optimal in imaging certain materials, and have different penetrative behavior vis-à-vis the specimen. One must bear in mind that 3D SEM imagery is collected in such a way as to produce isotropic resolution, whereas tomography looks at the specimen along a range of lines of sight that may not fill the full range of possible line-of-sights; this difference can have an effect on the volume that can be imaged and/or the (isotropy of the) resolution that can be attained, for instance.

The 3DSEM-constrained tomography approach provided by the present invention can be mathematically expressed in terms of an optimization problem:

$$\min_{U \in \mathcal{X}} \mu S(U) + \mathcal{D}(\mathcal{T}(U), g), g \in \mathbb{R}^m$$

$$S(U) := S_{Reg}(U) + \alpha S_{3DSEM}$$

in which:

$\mathcal{T} : \mathcal{X} \rightarrow \mathbb{R}^m$ is a sampled forward operator, where X is the domain of U, and $\mathbb{R}^m$ is the m-dimensional set of Real numbers.

$S: \mathcal{X} \rightarrow \mathbb{R}_+$ is a regularization functional, which uses a priori knowledge about $U_{true} \in \mathcal{X}$ to enforce uniqueness/stability, where $U_{true}$ is a density function describing the actual physical object to be reconstructed, and $\mathbb{R}_+$ is the set of all positive Real numbers.

$\mathcal{D} : \mathbb{R}^m \rightarrow \mathbb{R}_+$ is a data discrepancy functional, which qualifies the goodness-of-fit against measured data.

μ>1 is a regularization parameter, used to adjust the borderline between accuracy and stability, and depending inter alia on the employed noise model.

$S_{Reg}(U)$ expresses a priori regularity properties of $U_{true}$.

α is a weighting parameter that determines how strongly the $S_{3DSEM}$ term is taken into account in the regularization functional S.

$S_{3DSEM}$ is a regularization term based on the distance between the 3D SEM imagery and U, in a chosen metric (pixel gradient, pixel segmentation, scattering coefficients, etc.).

For good order, it is pointed out that, when performing tomographic imaging, there are various ways in which to acquire a set of input images (for use in subsequent tomographic reconstruction). For example, one can make use of:

A circular scan, in which the source follows a planar orbit about the specimen, and images are captured at a very high sampling rate (i.e. quasi-continuously) along this orbit. This type of scan can be applied in situations where only a relatively thin "slice" of a specimen has to be imaged.

A helical scan, in which the source follows a coil-like (spiral) path about a (longitudinal) axis of the specimen, and images are again captured at a very high sampling rate (i.e. quasi-continuously) along this path. This type of scan can be applied in situations where a relatively elongated portion of a specimen has to be imaged. It is typically achieved by combining circular motion (e.g. of the source) and concurrent translational motion (e.g. of the specimen).

A "matrix" of sampling points, which are not disposed along a curve, but are instead arranged in a substantially uniform distribution. Such a scenario is set forth in co-pending European Patent Application EP15181202.1/U.S. patent application Ser. No. 15/237, 309 (with the same assignee as the present application).

Embodiment 1

FIG. 1A is a highly schematic depiction of an embodiment of a CPM 1 that can be used in conjunction with the present invention; more specifically, it shows an embodiment of a SEM. The microscope 1 comprises a particle-optical column/illuminator 3, which produces a beam 5 of charged particles (in this case, an electron beam) that propagates along a particle-optical axis 5'. The particle-optical column 3 is mounted on a vacuum chamber 7, which comprises a specimen holder 9 and associated stage/actuator 11 for holding/positioning a specimen 13. The vacuum chamber 7 is evacuated using vacuum pumps (not depicted). With the aid of voltage source 15, the specimen holder 9, or at least the specimen 13, may, if desired, be biased (floated) to an electrical potential with respect to ground.

The particle-optical column 3 comprises an electron source 17 (such as a Schottky emitter), (electrostatic/magnetic) lenses 19, 21 (in general, more complex in structure than the schematic depiction here) to focus the electron beam 5 onto the specimen 13, and a deflection unit 23 to perform beam deflection/scanning of the beam 5. When the beam 5 impinges on/is scanned across the specimen 13, it will precipitate emission of various types of "stimulated" radiation, such as backscattered electrons, secondary electrons, X-rays and cathodoluminescence (infra-red, visible and/or ultra-violet photons); one or more of these radiation types can then be sensed/recorded using one or more detectors, which may form an image, spectrum, diffractogram, etc., typically by assembling a "map" (or "matrix") of detector output as a function of scan position on the specimen. The present Figure shows two such detectors, 25, 27, which may, for example, be embodied as follows:

Detector 25 may, for example, be an electron detector (such as an Solid State Photo-Multiplier), X-ray detector (such as an SDD or Si(Li) sensor) or a light detector (such as a photodiode).

Detector 27 is a segmented electron detector, comprising a plurality of independent detection segments (e.g. quadrants) disposed about a central aperture 29 (allowing passage of the beam 5). Such a detector can, for example, be used to investigate (the angular dependence of) a flux of output (secondary or backscattered) electrons emerging from the specimen 13.

These are just examples, and the skilled artisan will understand that other detector types, numbers and geometries/configurations are possible.

The microscope 1 further comprises a controller/computer processing unit 31 for controlling inter alia the lenses 19 and 21, the deflection unit 23, and detectors 25, 27, and displaying information gathered from the detectors 25, 27 on a display unit 33 (such as a flat panel display); such control occurs via control lines (buses) 31'. The controller 31 (or another controller) can additionally be used to perform various mathematical processing, such as combining, integrating, subtracting, false colouring, edge enhancing, and other processing known to the skilled artisan. In addition, automated recognition processes (e.g. as used for particle analysis) may be included in such processing.

Also depicted is a vacuum port 7', which may be opened so as to introduce/remove items (components, specimens) to/from the interior of vacuum chamber 7 (load lock), or onto which, for example, an ancillary device/module may be mounted (not depicted). A microscope 1 may comprise a plurality of such ports 7', if desired.

Figure 1B:
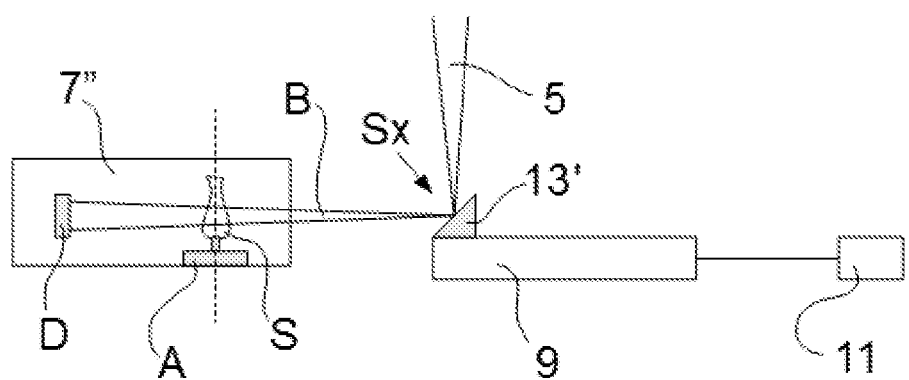
FIG. 1B illustrates a CT module suitable for use in a CPM such as that shown in FIG. 1A.

In the context of the current invention, the microscope 1 can also comprise an in situ CT module 7" as shown in FIG. 1B. In this figure, the CPM's specimen holder 9 has been provided with a metal target 13', which is positioned (using actuator 11) so that electron beam 5 impinges upon it, thus producing X-rays in a variety of directions. The Figure shows a beam B of such X-rays that propagate to one side from target 13' (effective source Sx) into module 7", where they pass through a specimen S and impinge upon a detector D. The specimen S is mounted on a stage apparatus A that allows the specimen S to be positioned/moved (typically translated and rotated) relative to the source Sx.

Such a CT module 7" may be permanently present (ab initio) in the vacuum enclosure 7, or it may be an add-on module that can be mounted (post-manufacture of the CPM 1) on/within a spare vacuum port 7', for example. As an alternative to the use of an in situ CT module 7", the present invention also allows the use of a standalone CT apparatus, if desired/required. In that context, one could, of course, make use of a TEM/STEM to perform charged particle tomography.

In the specific context of the present invention, 3D SEM image data of (a relevant part of) specimen S—obtained in a previous measurement session using SEM 1, or using a different SEM—are made available to controller 31 (or a similar such controller in a standalone CT apparatus). In line with the explanation given above, the controller 31 uses this 3D SEM data to mathematically constrain the (solution space of the) tomographic reconstruction that it calculates based on a set of input images (sinogram) of specimen S obtained using the CT module 7" (or standalone CT apparatus).

We claim:

1. A method of investigating a specimen using tomographic imaging, comprising:
   directing a tomographic radiation beam through the specimen and onto a detector, thereby generating an image of the specimen;
   repeating said directing for a set of different specimen orientations relative to said tomographic radiation beam, thereby generating a corresponding set of images;
   using an iterative mathematical reconstruction technique to convert said set of images obtained with the tomographic radiation beam into a tomogram of at least a portion of the specimen;
   mathematically constraining said reconstruction into the tomogram to curtail a solution space resulting therefrom, characterized by:
   obtaining three-dimensional Scanning Electron Microscope (SEM) imagery of at least a part of the specimen that overlaps at least partially with said portion of the specimen associated with the tomogram, wherein the three-dimensional Scanning Electron Microscope (SEM) imagery is obtained by scanning an electron beam, and
   using said SEM imagery to perform said constraining by requiring iterative results of said reconstruction to be consistent with pixel values derived from said SEM imagery.

2. The method of claim 1, wherein said tomographic imaging is selected from the group comprising Transmission Electron Microscope (TEM) tomography, Scanning Transmission Electron Microscope (STEM) tomography, X-ray Laminography, and combinations hereof.

3. The method according of claim 1, wherein said pixel values are derived using at least one of a pixel segmentation and a pixel gradient technique.

4. A method according of claim 1, wherein said pixel values comprise position-dependent physical attributes.

5. A tomographic imaging apparatus comprising:
   a tomographic imaging source, for producing a beam of radiation that can be directed through the specimen onto a detector to generate an image of at least part of the specimen;
   an adjustment mechanism for producing a set of different specimen orientations relative to the beam, allowing a corresponding set of images to be generated;
   a processing apparatus configured to:
      apply an iterative mathematical reconstruction technique to convert the set of images into a tomogram,
      mathematically constrain the reconstruction into the tomogram to curtail a solution space resulting therefrom, wherein the constraining comprises:
         accessing three-dimensional Scanning Electron Microscope (SEM) imagery of at least a portion of the specimen; and
         using the SEM imagery to perform the constraining by requiring iterative results of said reconstruction to be consistent with pixel values derived from the SEM imagery.

6. A tomographic apparatus as claimed in claim 5, which is comprised in a charged particle microscope.

7. A method of investigating a specimen using tomographic imaging, comprising:
   repetitively directing a tomographic radiation beam through a specimen and onto a detector, thereby generating corresponding specimen images for a set of different specimen orientations relative to the tomographic radiation beam;
   iteratively reconstructing to convert the set of images into a tomogram of at least a portion of the specimen, wherein the reconstructing into the tomogram is constrained to curtail a solution space resulting therefrom, wherein the constraining includes:
      obtaining at least one three-dimensional Scanning Electron Microscope (SEM) image of at least a part of the specimen that overlaps at least partially with the portion of the specimen associated with the tomogram, and
      using the at least one three-dimensional SEM image to perform the constraining by requiring iterative results of the reconstruction to be consistent with pixel values derived from the at least one three dimensional SEM image.

8. The method of claim 7, wherein the tomographic imaging is selected from the group comprising Transmission Electron Microscope (TEM) tomography, Scanning Transmission Electron Microscope (STEM) tomography, X-ray Laminography, and combinations hereof.

9. The method of claim 8, wherein the pixel values are derived using at least one of pixel segmentation and a pixel gradient technique.

10. The method of claim 7, wherein the pixel values are derived using at least one of pixel segmentation and a pixel gradient technique.

11. The method of claim 10, wherein the pixel values comprise a position-dependent physical attribute.

12. The method of claim 9, wherein the pixel values comprise a position-dependent physical attribute.

13. The method of claim 8, wherein the pixel values comprise a position-dependent physical attribute.

14. The method of claim 7, wherein the pixel values comprise a position-dependent physical attribute.

15. The method of claim 14, wherein the position-dependent physical attribute is an atomic scattering coefficient.

16. The method of claim 13, wherein the position-dependent physical attribute is an atomic scattering coefficient.

17. The method of claim 12, wherein the position-dependent physical attribute is an atomic scattering coefficient.

18. The method of claim 11, wherein the position-dependent physical attribute is an atomic scattering coefficient.

19. A method according of claim 1, wherein said pixel values comprise position-dependent atomic scattering coefficients.

* * * * *